United States Patent
Wang et al.

(10) Patent No.: US 6,627,527 B1
(45) Date of Patent: Sep. 30, 2003

(54) METHOD TO REDUCE METAL SILICIDE VOID FORMATION

(75) Inventors: Maureen Wang, Hsin-Chu (TW); Chi-Wei Chang, Hsin-Chu (TW); Winston Shue, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/268,212

(22) Filed: Oct. 10, 2002

(51) Int. Cl.[7] ............... H01L 21/3205; H01L 21/4763; H01L 21/336
(52) U.S. Cl. ............... 438/592; 438/300; 438/976
(58) Field of Search ............... 438/300, 592, 438/301, 303, 612, 682, 655, 976

(56) References Cited

U.S. PATENT DOCUMENTS

| | | | |
|---|---|---|---|
| 5,194,405 A | | 3/1993 | Sumi et al. ............... 437/200 |
| 5,612,082 A | * | 3/1997 | Azuma et al. ....... 257/E21.266 |
| 5,634,974 A | * | 6/1997 | Weimer et al. ............... 117/103 |
| 5,759,262 A | * | 6/1998 | Weimer et al. ............... 117/88 |
| 5,874,342 A | * | 2/1999 | Tsai et al. ............... 438/301 |
| 5,902,129 A | * | 5/1999 | Yoshikawa et al. ......... 438/592 |
| 5,937,325 A | * | 8/1999 | Ishida ............... 438/655 |
| 6,107,192 A | | 8/2000 | Subrahmanyan et al. ... 438/637 |
| 6,136,678 A | | 10/2000 | Adetutu et al. ............. 438/592 |
| 6,207,562 B1 | | 3/2001 | Han ............... 438/664 |
| 6,294,434 B1 | * | 9/2001 | Tseng ............... 438/303 |
| 6,329,277 B1 | * | 12/2001 | Liu et al. ............... 438/612 |
| 6,365,516 B1 | * | 4/2002 | Frenkel et al. ............. 438/682 |
| 6,555,437 B1 | * | 4/2003 | Yu ............... 438/300 |

* cited by examiner

Primary Examiner—John F. Niebling
Assistant Examiner—Walter L. Lindsay, Jr.
(74) Attorney, Agent, or Firm—George O. Saile; Stephen B. Ackerman

(57) ABSTRACT

A method of forming a low resistance metal silicide layer on a narrow width, conductive gate structure, has been developed. After formation of a metal silicide layer on a conductive gate structure via a self-aligned metal silicide (salicide), procedure, unreacted metal is removed via a selective wet etch procedure. Components of the wet etch procedure incorporated in the metal silicide layer, are next removed via a medium temperature—high vacuum anneal procedure. Removal of the wet etch components incorporated in the metal suicide layer allow a final anneal procedure to convert the metal silicide layer to a lower resistance metal silicide layer, without voids or agglomerated regions of metal silicide which may have formed during the final anneal if the incorporated wet etch components had not been removed.

33 Claims, 2 Drawing Sheets

METHOD TO REDUCE METAL SILICIDE VOID FORMATION

BACKGROUND OF THE INVENTION

(1) Field of the Invention

The present invention relates to methods used to fabricate semiconductor devices, and more specifically to a process sequence for forming metal silicide layers with reduced porosity and voids.

(2) Description of Prior Art

Micro-miniaturization, or the ability to fabricate semiconductor devices comprised with sub-micron features, has allowed device performance to be increased while the processing costs for these same devices have been reduced. The use of sub-micron features have allowed performance degrading junction capacitances to be reduced, while the number of smaller semiconductor chips realized from a specific size semiconductor wafer have allowed the processing costs for a specific semiconductor chip to be reduced. However specific aspects of micro-miniaturization can present fabrication situations which have to be addressed. For example the narrower channel regions now available with micro-miniaturization result in word line widths of 0.20 um or less. To adequately reduce word line resistance for narrow word lines optimum self-aligned metal silicide (salicide), layers are needed, formed overlying conductive gate structures. However voids in the metal silicide layer, or agglomerated metal silicide regions, can adversely influence the resistance of the narrow word lines to a greater degree than similar voids or for agglomeration metal silicide regions overlying wider gate structures.

One aspect of the salicide process which can result in voids or agglomeration adversely influencing salicide resistance, is the process used to selectively remove unreacted metal from regions in which the metal layer overlaid non-silicon regions. This process step is performed after a first anneal procedure is used to form a first phase metal silicide layer on conductive areas of a metal oxide semiconductor field effect transistor (MOSFET), device, areas such as source/drain regions and conductive gate structures. The selective removal of unreacted metal is performed in wet solutions containing components that can be incorporated into the first phase metal silicide layer. A subsequent second anneal procedure used to convert the first phase metal silicide layer to a lower resistance, second phase metal silicide layer, can not remove the incorporated components of the previously performed selective wet removal procedure, thus allowing the incorporated components of the selective wet removal procedure to remain in the final, or second phase metal silicide layer, during this anneal procedure resulting in unwanted voids and agglomerated metal silicide regions.

The present invention will teach a process for removing the components incorporated into a first phase metal silicide layer during the wet etch procedure used to selectively remove unreacted metal, prior to initiation of a final anneal procedure used to form the low resistance, second phase metal silicide layer, thus reducing metal silicide voids and agglomerated regions. Prior art, such as Han, in U.S. Pat. No. 6,207,562 B1, Adetut et al, in U.S. Pat. No. 6,136,678, Subrahmanyan et al, in U.S. Pat. No. 6,107,192, and Sumi et al, in U.S. Pat. No. 5,194,405, describe methods of forming metal silicide layers on regions of a semiconductor device. However none of the above prior art describe the novel process sequence employed in the present invention in which a critical process step is performed after selective removal of unreacted metal, and before a final anneal procedure used to convert a high resistance metal silicide phase to a lower resistance metal silicide phase. The critical process step removes components incorporated into the high resistance metal silicide phase, components that were incorporated into the metal silicide layer during the procedure used to remove unreacted metal. The removal of these incorporated species reduce the risk of voids or agglomeration in the lower resistance, final metal silicide phase.

SUMMARY OF THE INVENTION

It is an object of this invention to form a low resistance metal silicide layer on a word line structure of a MOSFET device.

It is another object of this invention to perform a procedure to remove components incorporated into a high resistance first metal silicide layer during the selective removal of unreacted metal, with the procedure performed at a stage of the salicide process sequence prior to employment of a final anneal procedure which is used to convert the high resistance first metal silicide layer to a lower resistance second metal silicide layer.

It is still another object of this invention to remove the components incorporated into the high resistance first metal silicide layer during removal of unreacted metal, via a medium temperature, high vacuum procedure.

In accordance with the present invention a method of forming metal silicide on a word line structure featuring a medium temperature, high vacuum anneal procedure, used to remove components incorporated into a metal silicide layer during a procedure used to selectively remove unreacted metal, is described. After definition of a conductive gate structure, and formation of insulator spacers on the sides of the conductor gate structure, a metal layer is deposited. A first anneal procedure is employed to form a high resistance metal silicide phase on the top surface of the conductive gate structure, while areas in which the metal layer overlaid insulator remain unreacted. Removal of unreacted metal is accomplished via selective wet etch procedures, with components of the wet etch solution incorporated into the high resistance metal silicide phase. A high vacuum, medium temperature anneal procedure is used to remove the incorporated components of the selective wet etch procedure from the high resistance metal silicide layer. A second anneal is next performed to convert the high resistance metal silicide layer, now free of incorporated components of the selective wet etch procedure, to a low resistance metal silicide layer, resulting in a word line structure comprised of the low resistance metal silicide layer on the underlying conductive gate structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
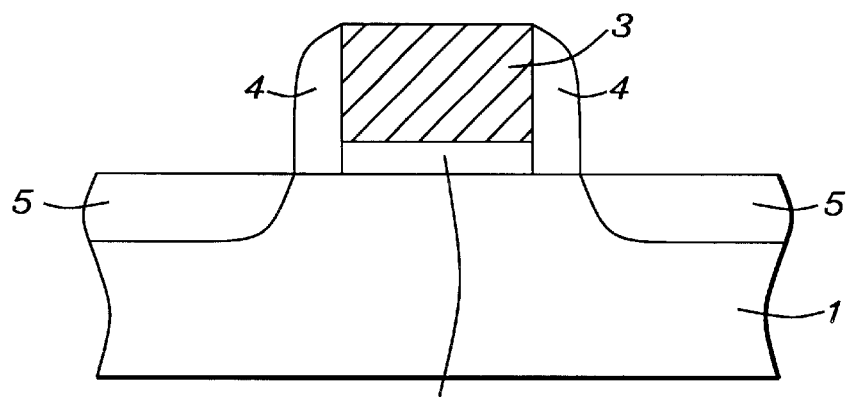
FIGS. 1–5, which schematically, in cross-sectional style, describe key stages of fabrication used to form metal silicide on a word line structure featuring a medium temperature, high vacuum anneal procedure used to remove components incorporated into a metal silicide layer during a wet etch procedure used to selectively remove unreacted metal.

The method of forming metal silicide layer on a word line structure featuring a medium temperature, high vacuum anneal procedure, used to remove components incorporated into a metal silicide layer during a wet etch procedure which in turn is used to selectively remove unreacted metal, will now be described in detail. Semiconductor substrate 1, comprised of P type, single crystalline silicon, featuring a <100> crystallographic orientation, is used and schematically shown in FIG. 1. Gate insulator layer 2, comprised of silicon dioxide at a thickness between about 10 to 50 Angstroms, is next thermally grown on the surface of semiconductor substrate 1, at a temperature between about 300 to 1000° C., in an oxygen—steam ambient. A conductive layer such as doped polysilicon is next deposited via low pressure chemical vapor deposition (LPCVD), procedures, to a thickness between about 900 to 3000 Angstroms. The polysilicon layer can be doped in situ during deposition via the addition of arsine or phosphine to a silane or disilane ambient, or the polysilicon layer can be deposited intrinsically than doped via the implantation of arsenic or phosphorous ions. If desired the polysilicon layer can remain undoped with the desired low word line resistance attainable via a subsequently formed, overlying metal silicide region. A photoresist shape, not shown in the drawings, is next used as an etch mask allowing an anisotropic reactive ion etch (RIE), procedure to define conductive gate structure 3, on gate insulator layer 2. The RIE procedure is performed using $Cl_2$ or $SF_6$ as a selective etchant for the conductive, or polysilicon layer, with the RIE procedure selectively terminating at the appearance of gate insulator layer 2. The narrow width of conductive gate structure 3, which influences the device channel length, is between about 0.025 to 0.20 um. Removal of the conductive gate structure defining photoresist shape is accomplished via plasma oxygen ashing and wet clean procedures, with a buffered hydrofluoric acid step, used as a component of the wet clean procedure, removing the portions of gate insulator layer 2, not covered by conductive gate structure 3. The result of these procedures is schematically shown in FIG. 1.

If desired a lightly doped source/drain (LDD), region can be formed in an area of semiconductor substrate 1, not covered by conductive gate structure 3. The LDD region, not shown in the drawings, can be obtained via implantation of arsenic or phosphorous ions, at an energy between about 1 to 100 KeV, at a dose between about 1E14 to 1E17 atoms/$cm^2$. An insulator layer such as silicon oxide, or silicon nitride, is next deposited at a thickness between about 100 to 5000 Angstroms, via LPCVD or via plasma enhanced chemical vapor deposition (PECVD), procedures. An anisotropic RIE procedure, using $CHF_3$ as an etchant for the silicon oxide option, or using $CF_4$ or $Cl_2$ as an etchant for the silicon nitride option, is employed to define insulator spacers 4, on the sides of conductive gate structures 3. The formation of heavily doped region 5, is next addressed via implantation of arsenic or phosphorous ions at an energy between about 1 to 200 KeV, at a dose between about 1E14 to 1E17 atoms/$cm^2$, with the N type ions implanted into areas of semiconductor substrate 1, not covered by conductive gate structure 3, or by insulator spacers 4. An optional anneal cycle can be performed at a temperature between about 700 to 1200° C., to activate the implanted ions. The result of these procedures is schematically shown in FIG. 1. This invention is described using an N channel, or an NMOS device, however the novel salicide procedures to be subsequently described in this invention can also be applied to a P channel, or PMOS device.

Figure 2:
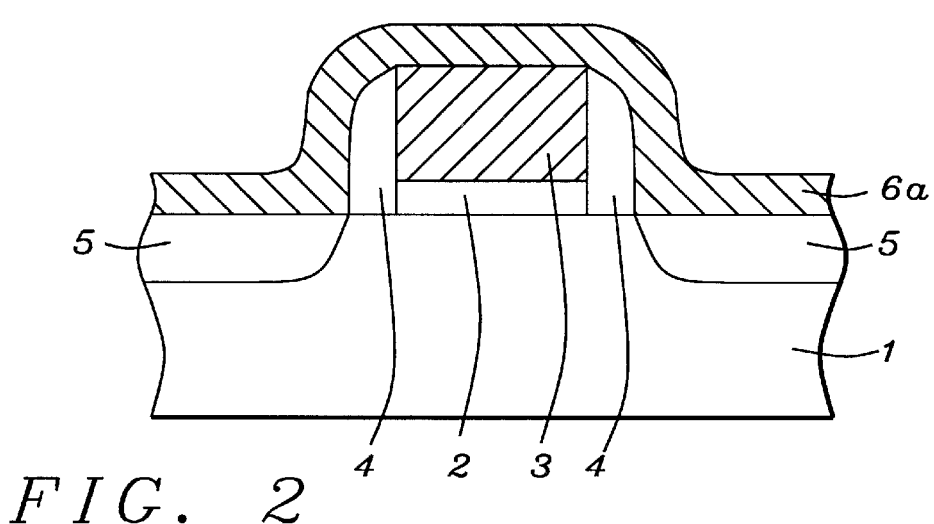
Figure 3:
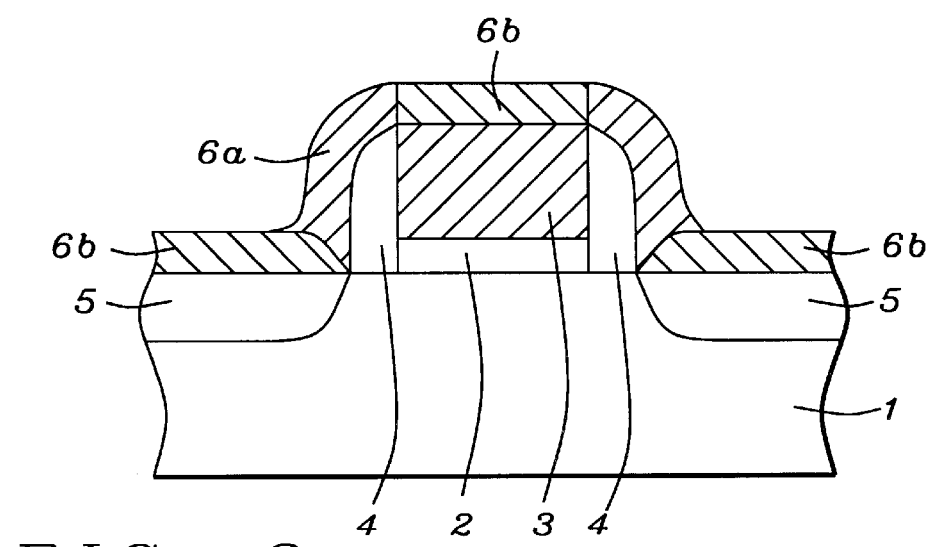

Metal layer 6a, comprised of an element such as cobalt, nickel, or titanium, is next deposited via plasma vapor deposition (PVD), procedures, to a thickness between about 10 to 500 Angstroms. This is schematically shown in FIG. 2. A first anneal procedure is next used to selectively form a high resistance, metal silicide layer 6b, on areas in which metal layer 6a, overlaid conductive gate structure 3, and on areas in which metal layer 6a, overlaid heavily doped source/drain region 5, while areas in which metal layer 5, overlaid non-conductive, insulator spacers 4, remain unreacted. The anneal procedure can be performed using conventional furnace processing, at a temperature between about 300 to 700° C., for a time between about 1 to 100 min, in an inert ambient, or the procedure can be accomplished via rapid thermal annealing, performed at a temperature between about 300 to 700° C., for a time between about 5 to 300 sec, in an inert ambient. Metal silicide layer 6b, is formed with a sheet resistance between about 5 to 500 ohms/square. The result of the first anneal procedure is schematically shown in FIG. 3.

Figure 4:
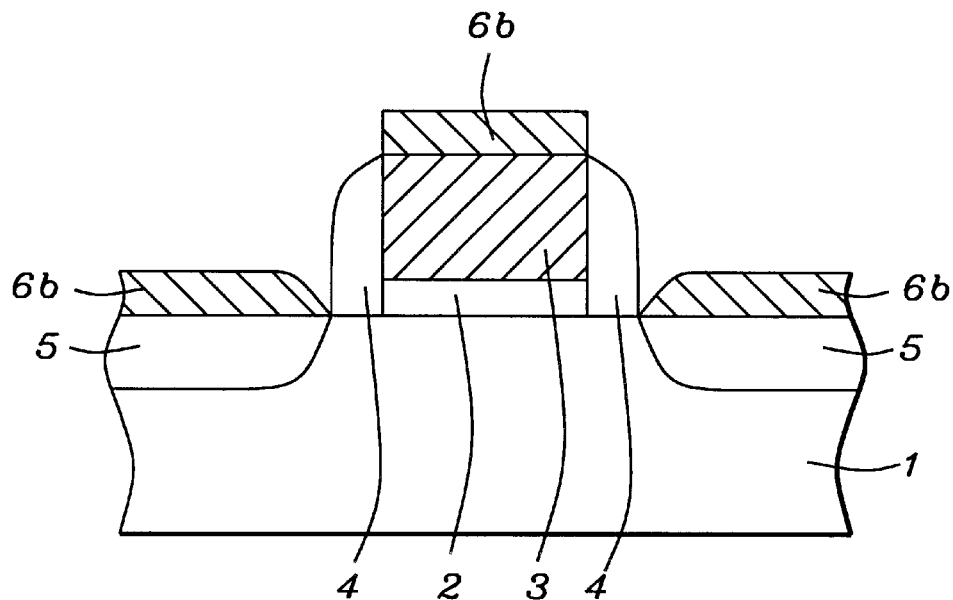

Removal of unreacted metal layer 6a, is next addressed and accomplished selectively via use of a wet etch procedure, performed using a solution comprised with either $H_2O_2$—$H_2SO_4$, $HCl$—$H_2O_2$, $H_2O_2$—$NH_4OH$—$H_2O$, $H_3PO_4$, $HNO_3$, or $CH_3COOH$, at a temperature between about 25 to 150° C. This is schematically shown in FIG. 4. Metal silicide layer 6b, is not removed during the selective removal of unreacted metal layer 6a, however components of the wet etch solution, including moisture are absorbed and incorporated into metal silicide layer 6b, during the selective wet etch procedure. If the species incorporated in metal silicide layer 6b, are not removed prior to a second anneal procedure, used to reduce the resistance of metal silicide layer 6b, voids and agglomerated areas will form in the metal silicide layer resulting in unwanted high word line resistance. The influence of the voids and agglomeration of metal silicide is exaggerated with word lines comprised with narrow widths, therefore making the removal of the incorporated species, prior to a final anneal procedure, imperative.

The procedure used to remove the species incorporated in metal silicide layer 6b, will now be addressed. A second anneal procedure performed in a vacuum, or using a chamber pressure less than 10 mtorr, is employed at a temperature between about 100 to 350° C., for a time between about 1 to 10 min, resulting in removal of the species incorporated in metal silicide layer 6b, incorporated during the selective wet etch procedure used to remove unreacted metal.

The temperature range is chosen at a level high enough to provide energy for the incorporated species to be volatilized, yet maintained at a level low enough to avoid conversion of the high resistance metal silicide layer to a lower resistance metal silicide phase. If a higher temperature anneal were used unwanted voids and agglomeration would form in metal silicide layer 6b. Therefore the conversion of the high resistance metal silicide layer to a lower resistance metal silicide layer, performed at higher temperatures, has to be delayed until the incorporated species is removed via the medium temperature—high vacuum anneal procedure.

Figure 5:
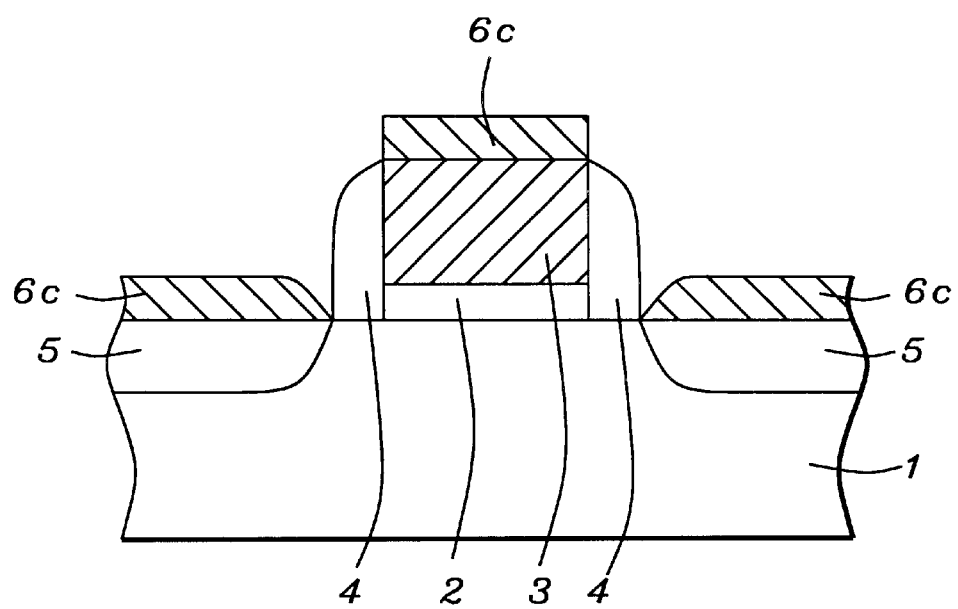

After removal of the incorporated species via the vacuum anneal procedure, a third anneal procedure is performed to convert metal silicide layer 6b, to lower resistance, metal silicide layer 6c. The third anneal procedure is performed at a temperature between about 650 to 1000° C., for a time between about 1 to 100 min, in an inert ambient, using conventional furnace procedures. If desired the third anneal procedure can be performed in situ, in the same tool or chamber used to perform the medium temperature—high vacuum anneal. In addition if desired the third anneal procedure can be performed using rapid thermal annealing procedures, at a temperature between about 650 to 1000° C., for a time between about 5 to 300 sec, in an inert ambient. The third anneal procedure results in metal silicide layer 6c, schematically shown in FIG. 5, featuring a sheet resistance between about 1 to 20 ohms/square. The ability to convert high resistance, metal silicide layer 6b, to lower resistance, metal silicide layer 6c, via the third anneal procedure, would have been compromised in terms of voids and agglomeration if the incorporated species of the previous wet etch removal procedure were not removed via the use of the second anneal, or the medium temperature—high vacuum anneal procedure.

While this invention has been particularly shown and described with reference to the preferred embodiments thereof, it will be understood by those skilled in the art that various changes in form and details may be made without departing from the spirit and scope of this invention.

What is claimed is:

1. A method of forming metal silicide layer on a semiconductor substrate, comprising the steps of:

providing a conductive gate structure on an underlying gate insulator layer, with insulator spacers located on the sides of the conductive gate structure, and with source/drain regions in portions of the semiconductor substrate not covered by the conductive gate structure or by the insulator spacers;

forming a metal layer;

performing a first anneal procedure at a first temperature to form a first metal silicide layer on said source/drain region and on the top surface of said conductive gate structure, while said metal layer located on said insulator spacers remains unreacted;

selectively removing said unreacted metal layer from said insulator spacers;

performing a second anneal procedure in a vacuum at a second temperature, with said second temperature lower than said first temperature; and performing a third anneal procedure at a third temperature, with said third temperature equal to, or greater than said first temperature, converting said first metal silicide layer to a second metal silicide layer, wherein said second metal silicide layer is comprised with a lower sheet resistance than said first metal silicide layer.

2. The method of claim 1, wherein said gate insulator layer is a silicon dioxide layer at a thickness between about 10 to 50 Angstroms, obtained via thermal oxidation procedures performed at a temperature between about 300 to 1000° C., in an oxygen steam ambient.

3. The method of claim 1, wherein said conductive gate structure is comprised of doped polysilicon, at a thickness between about 900 to 3000 Angstroms.

4. The method of claim 1, wherein said conductive gate structure is comprised of an undoped polysilicon, at a thickness between about 900 to 3000 Angstroms.

5. The method of claim 1, wherein the width of said conductive gate structure is between about 0.025 to 0.20 um.

6. The method of claim 1, wherein said insulator spacers are comprised of silicon oxide or silicon nitride, at a thickness between about 100 to 5000 Angstroms.

7. The method of claim 1, wherein said source/drain region is a heavily doped N type source/drain region, obtained via an ion implantation procedure performed using arsenic or phosphorous ions at an energy between about 1 to 200 KeV, at a dose between about 1E14 to 1E17 atoms/cm$^2$.

8. The method of claim 1, wherein said metal layer is chosen from a group containing cobalt, titanium, and nickel, obtained at a thickness between about 10 to 500 Angstroms via plasma vapor deposition procedures.

9. The method of claim 1, wherein said first anneal procedure is performed at said first temperature, between about 300 to 700° C., for a time between about 1 to 100 min, in an inert ambient, using conventional furnace procedures.

10. The method of claim 1, wherein said first anneal procedure is performed using rapid thermal annealing, performed at said first temperature, between about 300 to 700° C., for a time between about 5 to 300 sec, in an inert ambient.

11. The method of claim 1, wherein the sheet resistance of said first metal silicide layer is between about 5 to 500 ohms/square.

12. The method of claim 1, wherein said unreacted metal layer is removed via a wet etch procedure, performed using a solution comprised with either $H_2O_2$—$H_2SO_4$, HCl—$H_2O_2$, $H_2O_2$—$NH_4OH$—$H_2O$, $H_3PO_4$, $HNO_3$, or $CH_3COOH$ at a temperature between about 25 to 150° C.

13. The method of claim 1, wherein said second temperature of said second anneal procedure is between about 100 to 350° C.

14. The method of claim 1, wherein said second anneal procedure is performed in a vacuum, at a pressure less than 100 mtorr.

15. The method of claim 1, wherein said third anneal procedure is performed at said third temperature, between about 650 to 1000° C., for a time between about 1 to 100 min, in an inert ambient, using conventional furnace procedures.

16. The method of claim 1, wherein said third anneal procedure is performed using rapid thermal annealing, performed at said third temperature between about 650 to 1000° C., for a time between about 5 to 300 sec, in an inert ambient.

17. The method of claim 1, wherein said the sheet resistance of said second metal silicide layer is between about 1 to 20 ohms/square.

18. A method of forming metal silicide on a semiconductor substrate, featuring a medium temperature—high vacuum anneal procedure used to remove species incorporated in a metal silicide layer during a wet etch procedure which is used to remove unreacted metal, comprising the steps of:

providing a polysilicon gate structure on an underlying silicon dioxide gate insulator layer, with insulator spacers located on the sides of the polysilicon gate structure, and with source/drain regions located in portions of the semiconductor substrate not covered by the polysilicon gate structure or by the insulator spacers, depositing a metal layer;

performing a first anneal procedure at a first temperature to form a high resistance metal silicide layer on said source/drain region and on the top surface of said polysilicon gate structure, while said metal layer located on said insulator spacers remains unreacted;

performing said wet etch procedure to selectively remove said unreacted metal layer;

performing said medium temperature—high vacuum anneal procedure at a second temperature, with said second temperature lower than said first temperature, to remove species incorporated in said high resistance metal silicide layer during said wet etch procedure; and performing a second anneal procedure at a third temperature, in situ in same chamber used to perform said medium temperature—high vacuum anneal procedure, with said third temperature equal to, or greater than said first temperature, converting said high resistance metal silicide layer to a low resistance metal suicide layer.

19. The method of claim 18, wherein said silicon dioxide gate insulator layer is obtained via thermal oxidation procedures at a thickness between about 10 to 50 Angstroms.

20. The method of claim 18, wherein said polysilicon gate structure is a doped polysilicon gate structure, comprised at a thickness between about 900 to 3000 Angstroms.

21. The method of claim 18, wherein said polysilicon gate structure is an undoped polysilicon gate structure, comprised at a thickness between about 900 to 3000 Angstroms.

22. The method of claim 18, wherein the width of said polysilicon gate structure is between about 0.025 to 0.20 um.

23. The method of claim 18, wherein said insulator spacers are comprised of silicon oxide or silicon nitride, at a thickness between about 100 to 5000 Angstroms.

24. The method of claim 18, wherein said source/drain region is a heavily doped N type source/drain region, obtained via an ion implantation procedure performed using arsenic or phosphorous ions at an energy between about 1 to 200 KeV, at a dose between about 1E14 to 1E17 atoms/cm$^2$.

25. The method of claim 18, wherein said metal layer is chosen from a group containing cobalt, titanium, and nickel, wherein said metal layer is obtained at a thickness between about 10 to 500 Angstroms via plasma vapor deposition procedures.

26. The method of claim 18, wherein said first anneal procedure is performed at said first temperature, between about 300 to 700° C., for a time between about 1 to 100 min, in an inert ambient, using conventional furnace procedures.

27. The method of claim 18, wherein said first anneal procedure is performed using rapid thermal annealing, performed at said first temperature between about 300 to 700° C., for a time between about 5 to 300 sec, in an inert ambient.

28. The method of claim 18, wherein the sheet resistance of said high resistance metal silicide layer is between about 5 to 500 ohms/square.

29. The method of claim 18, wherein said unreacted metal layer is removed via a wet etch procedure, performed using a solution comprised with either $H_2O_2$—$H_2SO_4$, HCl—$H_2O_2$, $H_2O_2$—$NH_4OH$—$H_2O$, $H_3PO_4$, $HNO_3$, or $CH_3COOH$, at a temperature between about 25 to 150° C.

30. The method of claim 18, wherein said medium temperature—high vacuum anneal procedure is performed at said second temperature, between about 100 to 350° C., and at a pressure less than 100 mtorr.

31. The method of claim 18, wherein said second anneal procedure is performed at said third temperature, between about 650 to 1000° C., for a time between about 1 to 100 min, in an inert ambient, using conventional furnace procedures.

32. The method of claim 18, wherein said second anneal procedure is performed using rapid thermal annealing, at said third temperature between about 650 to 1000° C., for a time between about 5 to 300 sec, in an inert ambient.

33. The method of claim 18, wherein said the sheet resistance of said low resistance metal silicide layer is between about 1 to 20 ohms/square.

* * * * *